(12) United States Patent
Chi (10) Patent No.: US 9,318,175 B1
(45) Date of Patent: Apr. 19, 2016

(54) WORD LINE DRIVER CIRCUIT FOR SEMICONDUCTOR MEMORY DEVICE

(71) Applicant: SK hynix Inc., Gyeonggi-do (KR)

(72) Inventor: Sung-Soo Chi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/699,783

(22) Filed: Apr. 29, 2015

(30) Foreign Application Priority Data

Dec. 19, 2014 (KR) .......................... 10-2014-0183747

(51) Int. Cl.
| G11C 5/06 | (2006.01) |
| G11C 8/08 | (2006.01) |
| G11C 5/02 | (2006.01) |
| G11C 8/12 | (2006.01) |
| G11C 11/4096 | (2006.01) |

(52) U.S. Cl.
CPC .. *G11C 8/08* (2013.01); *G11C 5/02* (2013.01); *G11C 8/12* (2013.01); *G11C 11/4096* (2013.01)

(58) Field of Classification Search
CPC .............. G11C 5/02; G11C 8/08; G11C 8/10; G11C 8/12; G11C 11/4096
USPC ....................... 365/72, 51, 63, 230.06, 185.23
See application file for complete search history.

(56) References Cited

U.S. PATENT DOCUMENTS

| 5,523,598 A * | 6/1996 | Watanabe ........... H01L 27/1104 257/301 |
| 5,640,359 A * | 6/1997 | Suzuki ..................... G11C 8/08 365/149 |
| 5,793,664 A * | 8/1998 | Nagata ..................... G11C 7/10 257/E27.085 |
| 6,221,723 B1 * | 4/2001 | Kunitou .............. H01L 21/8234 257/E21.616 |

FOREIGN PATENT DOCUMENTS

KR      1020060131334      12/2006

* cited by examiner

*Primary Examiner* — Gene Auduong
(74) *Attorney, Agent, or Firm* — IP & T Group LLP (57) ABSTRACT

A word line driver circuit may include a first active region, a second active region spaced apart from the first active region in a first direction and spaced apart from the first active region in a first direction and spaced apart from the first active region in a second direction, which is substantially perpendicular to the first direction, first contacts formed at both ends of each of the first and second active regions, second contacts formed in the first and second active regions between the first contacts, a gate region between the first contact formed on a second end of the first active region and the second contact and between the first contact formed on a first end of the second active region and the second contact in a straight line, counterclockwise surrounding a part of the second contact formed in the first active region, and clockwise surrounding a part of the second contact formed in the second active region.

22 Claims, 5 Drawing Sheets

WORD LINE DRIVER CIRCUIT FOR SEMICONDUCTOR MEMORY DEVICE

CROSS-REFERENCE TO RELATED APPLICATIONS

The present application claims priority of Korean Patent Application No. 10-2014-0183747, filed on Dec. 19, 2014, which is incorporated herein by reference in its entirety.

BACKGROUND

1. Field

Exemplary embodiments of the present invention relate to a semiconductor memory device and, more particularly, to a semiconductor memory device including a word line driver circuit for driving word lines.

2. Description of the Related Art

Figure 1:
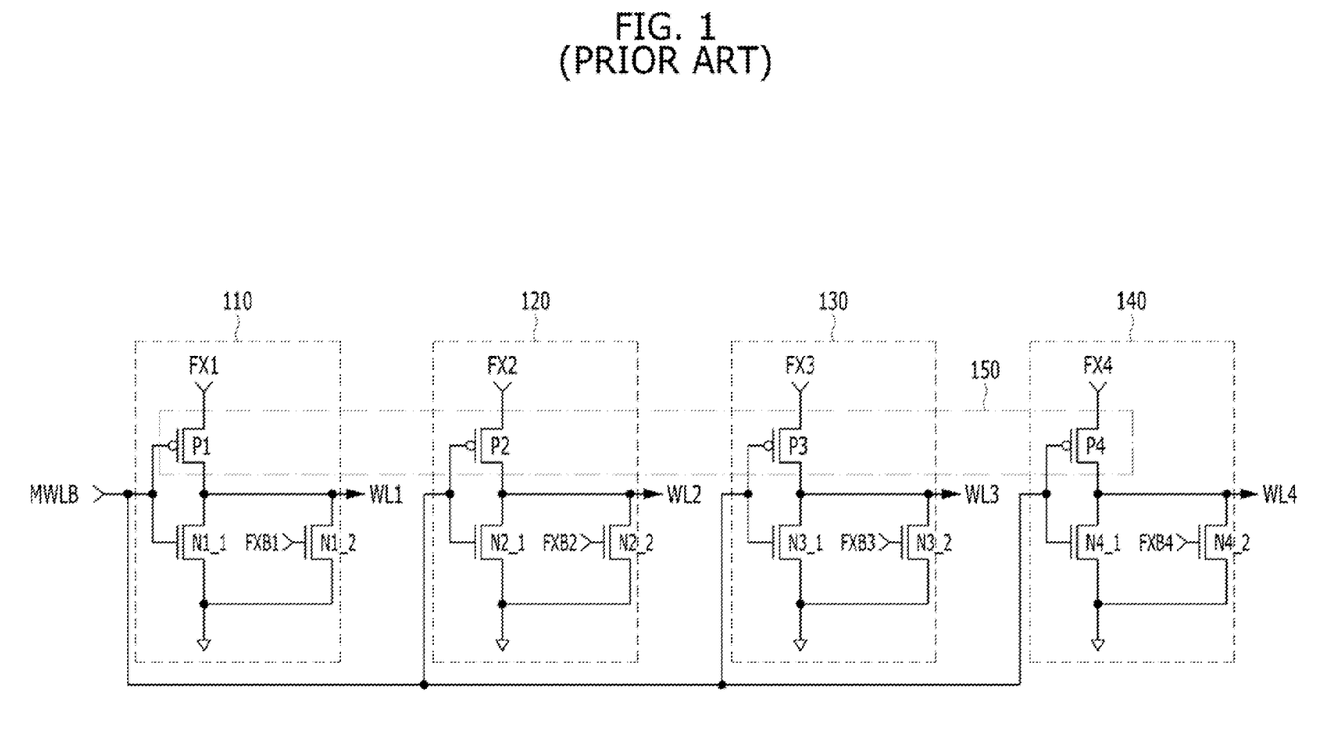
FIG. 1 is a circuit diagram illustrating a known word line driver circuit.

FIG. 1 is a circuit diagram illustrating a known word line driver circuit.

Referring to FIG. 1, the word line driver circuit includes first to fourth word line drivers 110 to 140. The word line driver circuit includes a PMOS transistor region 150 including first to fourth PMOS transistors P1 to P4.

The first word line driver 110 includes the first PMOS transistor P1 for pulling up a first word line signal WL1 to a level of a first sub-word line selection signal FX1 in response to a main word line signal MWLB, an NMOS transistor N1_1 for pulling down the first word line signal WL1 to a ground voltage level in response to the main word line signal MWLB, and an NMOS transistor N1_2 for pulling down the first word line signal WL1 to the ground voltage level in response to a first inverse sub-word line selection signal FXB1. The main word line signal MWLB is a memory cell driving signal transferred through a main word line. The first word line signal WL1 is a signal for driving a sub-word line. The first sub-word line selection signal FX1 is a signal having a specific voltage level based on address information that selects the sub-word line.

The first PMOS transistor P1 has a gate receiving the main word line signal MWLB, a source receiving the first sub-word line selection signal FX1, and a drain connected to an output line for outputting a signal that has been pulled up to the level of the first sub-word line selection signal FX1 as the first word line signal WL1.

The second to fourth word line drivers 120 to 140 have the same configurations as the first word line driver 110.

The first to fourth word line drivers 110 to 140 activate the first to fourth word line signals WL1 to WL4 in response to the main word line signal MWLB and the first to fourth sub-word line selection signals FX1 to FX4, respectively.

Figure 2:
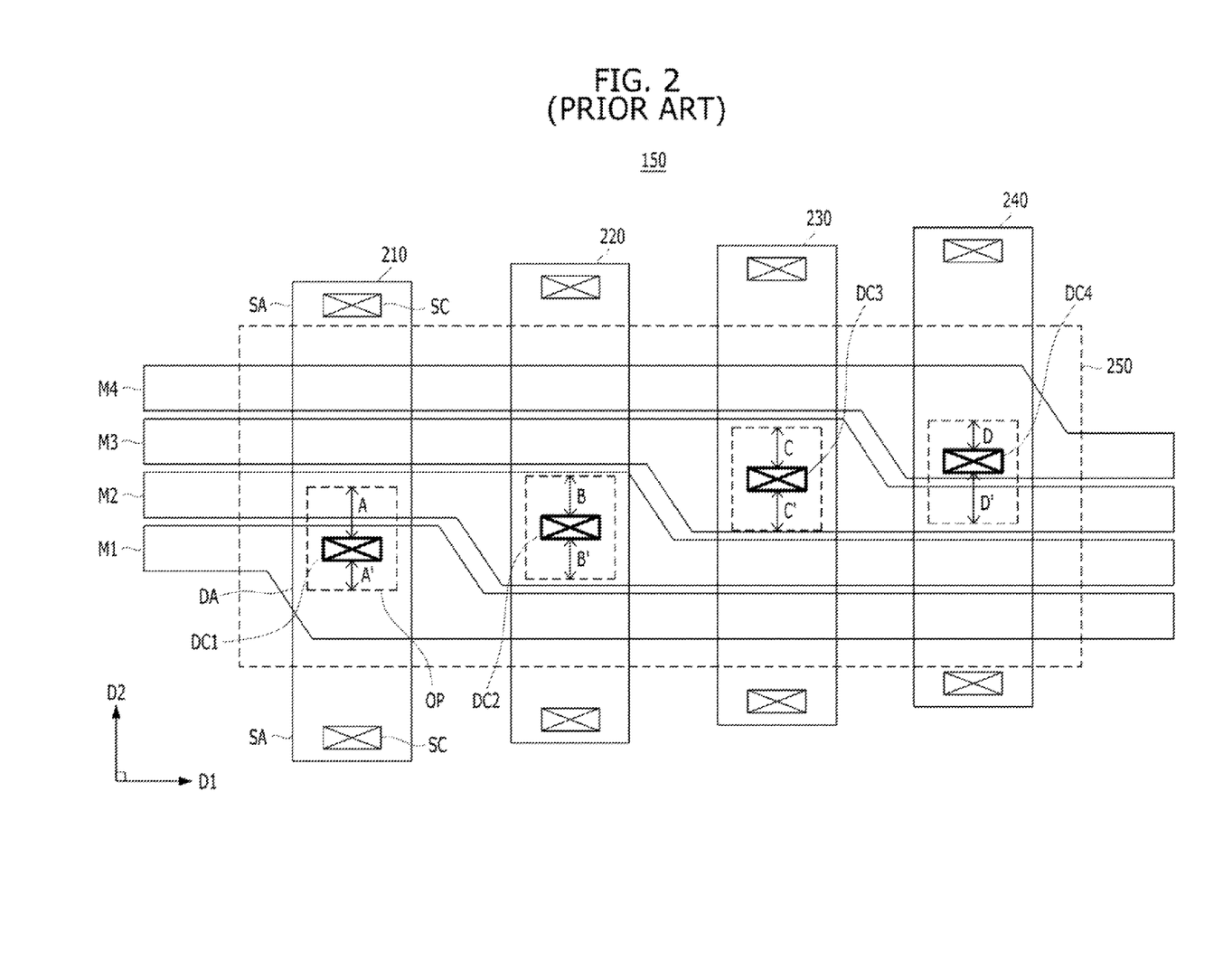
FIG. 2 is a layout diagram illustrating an arrangement of a PMOS transistor region illustrated in FIG. 1.

FIG. 2 is a layout diagram illustrating an arrangement of the PMOS transistor region 150 illustrated in FIG. 1.

Referring to FIG. 2, the PMOS transistor region 150 includes the first to fourth PMOS transistors (P1 to P4 of FIG. 1). The first to fourth PMOS transistors P1 to P4 include respective first to fourth active regions 210 to 240, a common gate region 250, and respective first to fourth metal lines M1 to M4.

The first to fourth active regions 210 to 240 are spaced apart from each other at specific intervals in a first direction D1.

Source regions SA are formed at both ends of each of the first to fourth active regions 210 to 240. Source contacts SC are formed in the source regions SA. The source contacts SC are connected to a metal line (not illustrated) and supplied with the first to fourth sub-word line selection signals (FX1 to FX4 of FIG. 1). The source contacts SC electrically connect the metal line (not illustrated) with the source regions SA.

Drain regions DA are formed in the first to fourth active regions 210 to 240 between the source regions SA formed at the both ends of each of the first to fourth active regions 210 to 240. First to fourth drain contacts DC1 to DC4 are formed in the drain regions DA formed in the first to fourth active regions 210 to 240, respectively.

The first to fourth drain contacts DC1 to DC4 are connected to the first to fourth metal lines M1 to M4 and supplied with the first to fourth word line signals (WL1 to WL4 of FIG. 1), respectively. The first to fourth metal lines M1 to M4 extend to a second direction D2, which is substantially perpendicular to the first direction D1, and are disposed to intersect the first to fourth active regions 210 to 240. The fourth metal line M4 is connected to the fourth drain contact DC4 formed in the fourth active region 240 and is electrically connected to the drain region DA of the fourth active region 240. The third metal line M3 is connected to the third drain contact DC3 formed in the third active region 230 and is electrically connected to the drain region DA of the third active region 230. The second metal line M2 is connected to the second drain contact DC2 formed in the second active region 220 and is electrically connected to the drain region DA of the second active region 220. The first metal line M1 is connected to the first drain contact DC1 formed in the first active region 210 and is electrically connected to the drain region DA of the first active region 210.

Each of the first to fourth metal lines M1 to M4 is configured to have the greatest width in an area where it is connected to each of the first to fourth drain contacts DC1 to DC4. Furthermore, each of the first to fourth metal lines M1 to M4 is configured to have a constant width in the remaining regions except for the area where it is connected to each of the first to fourth drain contacts DC1 to DC4.

The common gate region 250 is formed to surround the remaining regions except for the first to fourth drain contacts DC1 to DC4. The common gate region 250 includes four open parts OP. The open parts OP are formed by vertically penetrating the common gate region 250. The open parts OP are respectively configured to surround the first to fourth drain contacts DC1 to DC4 and to open the first to fourth drain contacts DC1 to DC4. The common gate region 250 is supplied with the main word line signal (MWLB of FIG. 1).

The first to fourth PMOS transistors P1 to P4 are driven in response to the first to fourth sub-word line selection signals FX1 to FX4 applied through the source contacts SC and the main word line signal MWLB applied through the common gate region 250. The first to fourth PMOS transistors P1 to P4 receive the respective first to fourth sub-word line selection signals FX1 to FX4 serving as pull-up driving signals selectively activated in response to the address information, through the source contacts SC. Accordingly, each of the first to fourth PMOS transistors P1 to P4 forms a current path between the corresponding source region and the corresponding drain region. The current path extends to the first to fourth metal lines M1 to M4 through the first to fourth drain contacts DC1 to DC4. The first to fourth word line signals WL1 to WL4 are activated due to the current path extended to the first to fourth metal lines M1 to M4.

More specifically, the second drain contact DC2 connected to the second metal line M2 and the third drain contact DC3 connected to the third metal line M3 are respectively formed in the centers of the metal lines M2 and M3 in the second direction D2 since the open parts OP of the common gate region 250 are formed to have the same pattern. In contrast, the first drain contact DC1 connected to the first metal line M1 and the fourth drain contact DC4 connected to the fourth metal line M4 are respectively inclined to sides of the metal lines M1 and M4 since the open parts OP of the common gate region 250 are formed to have the same size. Furthermore, the source contacts SC and the first to fourth drain contacts DC1 to DC4 formed in the first to fourth PMOS transistors P1 to P4 are not disposed in a line in the first direction D1. Accordingly, the intervals between the first to fourth drain contacts DC1 to DC4 and adjacent gate regions are not the same.

For example, assuming that the intervals between the first to fourth drain contacts DC1 to DC4 and one side of respective adjacent gate regions in the second direction D2 are A, B, C, and D and the intervals between the first to fourth drain contacts DC1 to DC4 and the other side of respective adjacent gate regions in the second direction D2 are A', B', C', and D.'

The interval B and the interval B' in the second transistor P2 are relatively the same. Likewise, the interval C and the interval C' in the third transistor P3 are relatively the same. In contrast, the interval A and the interval A' in the first PMOS transistor P1 are highly different. Likewise, the interval D and the interval D' in the fourth PMOS transistor P4 are highly different.

Accordingly, the first to fourth PMOS transistors P1 to P4 have driving forces that are different from each other since the intervals between the drain contacts DC1 to DC4 and the common gate region 250 are not the same. That is, a difference in the intervals between the common gate region 250 supplied with the main word line signal MWLB and the first to fourth drain contacts DC1 to DC4 results in a difference in the parasitic capacitance between the adjacent gate regions and the drain region DA. Due to the difference in the parasitic capacitance, operating speed that activates the first word line signal WL1 and operating speed that activates the fourth word line signal WL4 are different.

Furthermore, leakage current is further increased as the interval between the common gate region 250 and the first to fourth drain contacts DC1 to DC4 is narrowed. The leakage current generated from the first PMOS transistor P1 and the fourth PMOS transistor P4 have influence on the first and fourth word line signals WL1 and WL4 generated through the first PMOS transistor P1 and the fourth PMOS transistor P4. Some of a plurality of memory cells connected to the first to fourth word lines are not normally driven in response to the first and fourth word line signals WL1 and WL4. As a result, an increase of the leakage current causes unwanted current consumption in the word line driver circuit including a plurality of transistors and deteriorates performance of the plurality of transistors.

SUMMARY

Various embodiments are directed to the provision of a word line driver circuit for securing a uniform driving force for a plurality of transistors included in a word line driver circuit by disposing drain contacts and gate regions of the plurality of transistors at the same intervals.

In an embodiment, a word line driver circuit of a semiconductor memory device may include a first active region; a second active region spaced apart from the first active region in a first direction and spaced apart from the first active region in a second direction, which is substantially perpendicular to the first direction; first contacts formed at both ends of each of the first and second active regions; second contacts formed in the first and second active regions between the first contacts; and a gate region between the first contact formed on a second end of the first active region and the second contact formed in the first active region, and between the first contact formed on a first end of the second active region and the second contact formed in the second active region in a straight line, counterclockwise surrounding a part of the second contact formed in the first active region, and clockwise surrounding a part of the second contact formed in the second active region.

The gate region may have a structure in which a first side of the second contact formed in the first active region and a second side of the second contact formed in the second active region are open and the gate region is adjacent to the second contacts in a gap of a specific level.

The second active region may be below the first active region in the second direction on the same plane as the first active region.

The word line driver circuit may further include a first metal line that intersects the first and second active regions, including a protrusion region that protrudes from one side in an opposite direction to the second direction and coupled to the second contact formed in the first active region; and a second metal line that intersects the first and second active regions, and including a protrusion region that protrudes from one side in the second direction and coupled to the second contact formed in the second active region.

Each of the first metal line and the second metal line may maintain a constant width in the remaining regions except for the protrusion region coupled to the second contact.

The second contact formed in the first active region may be in the same line as the first contact formed on the first end of the second active region, and the second contact formed in the second active region may be in the same line as the first contact formed on the second end of the first active region.

The first contact may comprise a source contact electrically coupled to a source region, and the second contact may comprise a drain contact electrically coupled to a drain region.

In an embodiment, a word line driver circuit of a semiconductor memory device may include a first active region; a second active region spaced apart from the first active region at a first interval in a first direction and spaced apart from the first active region in a second direction, which is substantially perpendicular to the first direction; a third active region spaced apart from the second active region at a second interval in the first direction; a fourth active region spaced apart from the third active region at a third interval in the first direction and spaced apart from the third active region in the second direction; first contacts formed at both sides of ends of the first to fourth active regions; second contacts formed in the first to fourth active regions between the first contacts; a first gate region crossing between the first contact formed on a second end of the first active region and the second contact formed in the first active region and between the first contact formed on a first end of the second active region and the second contact formed in the second active region in a straight line, counterclockwise surrounding a part of the second contact formed in the first active region, and clockwise surrounding a part of the second contact formed in the second active region; and a second gate region between the first contact formed on a second end of the third active region and the second contact formed in the third active region and between the first contact formed on a first end of the fourth active region and the second contact formed in the fourth active region in a straight line, counterclockwise surrounding a part of the second contact formed in the third active region, and clockwise surrounding a part of the second contact formed in the fourth active region, wherein the first gate region partially overlaps with the second gate region.

The first gate region partially may overlap with the second gate region between the second active region and the third active region.

The first gate region may have a structure in which a first side of the second contact formed in the first active region and a second side of the second contact formed in the second active region are open and the first gate region is adjacent to the second contacts in a gap of a specific level.

The second gate region may have a structure in which a first side of the second contact formed in the third active region and a second side of the second contact formed in the fourth active region are open and the second gate region is adjacent to the second contacts in a gap of a specific level.

The second gate region and the first gate region may have a symmetrical structure.

The second active region may be below the first active region in the second direction on the same plane as the first active region, the third active region and the second active region may be parallel, and the fourth active region may be below the third active region in the second direction on the same plane as the third active region.

The word line driver circuit may further include a first metal line pair that intersects the first to third active regions, each metal line including a protrusion region coupled to the second contacts respectively formed in the first and second active regions; and a second metal line pair that intersects the second to fourth active regions, each metal line including a protrusion region coupled to the second contacts respectively formed in the third and fourth active regions.

The second metal line pair and the first metal line pair may have a symmetrical structure.

Each metal line of the first and second metal line pairs may maintain a constant width in the remaining regions except for the protrusion region coupled to the second contact.

The second contact formed in the first active region may be in the same line as the first contact formed on the first end of the second active region and the first contact formed on a first end of the third active region, the second contacts formed in the second active region and the third active region may be in the same line as the first contact formed on the second end of the first active region and the first contact formed on the first end of the fourth active region, and the second contact formed in the fourth active region may be in the same line as the first contact formed on a second end of the second active region and the first contact formed on the second end of the third active region.

The first contact may comprise a source contact electrically coupled to a source region, and the second contact may comprise a drain contact electrically coupled to a drain region.

The first interval may be wider than the second interval, and the third interval may be wider than the second interval.

In an embodiment, a word line driver circuit of a semiconductor memory device may include a first active region; a second active region spaced apart from the first active region in a first direction and spaced apart from the first active region in a second direction, which is substantially perpendicular to the first direction; a third active region that partially overlaps with the first active region in the second direction; a fourth active region that partially overlaps with the second active region in the second direction; first contacts formed at first ends of the first and second active regions, second ends of the third and fourth active regions, a first common end where the first and third active regions overlap with each other, and a second common end where the second and fourth active regions overlap with each other; second contacts formed in the first to fourth active regions between the first contacts; a first gate region between the first contact formed on the first common end and the second contact formed in the first active region and between the first contact formed on the first end of the second active region and the second contact formed in the second active region in a straight line, counterclockwise surrounding a part of the second contact formed in the first active region, and clockwise surrounding a part of the second contact formed in the second active region; and a second gate region between the first contact formed on the second end of the third active region and the second contact formed in the third active region and between the first contact formed on the second common end and the second contact formed in the fourth active region in a straight line, counterclockwise surrounding a part of the second contact formed in the third active region, and clockwise surrounding a part of the second contact formed in the fourth active region, wherein an end of the first gate region which clockwise surrounds the second contact formed in the second active region and an end of the second gate region which counterclockwise surrounds part of the second contact formed in the third active region are spaced apart from each other in the first direction and face each other.

The second contacts formed in the first to fourth active regions may zigzag in the second direction.

The first contacts formed in the first to fourth active regions may zigzag in the second direction.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to clearly illustrate features of the embodiments. When a first layer is referred to as being "on" a second layer or "on" a substrate, it not only refers to where the first layer is formed directly on the second layer or the substrate but also to where a third layer exists between the first layer and the second layer or the substrate.

Figure 3:
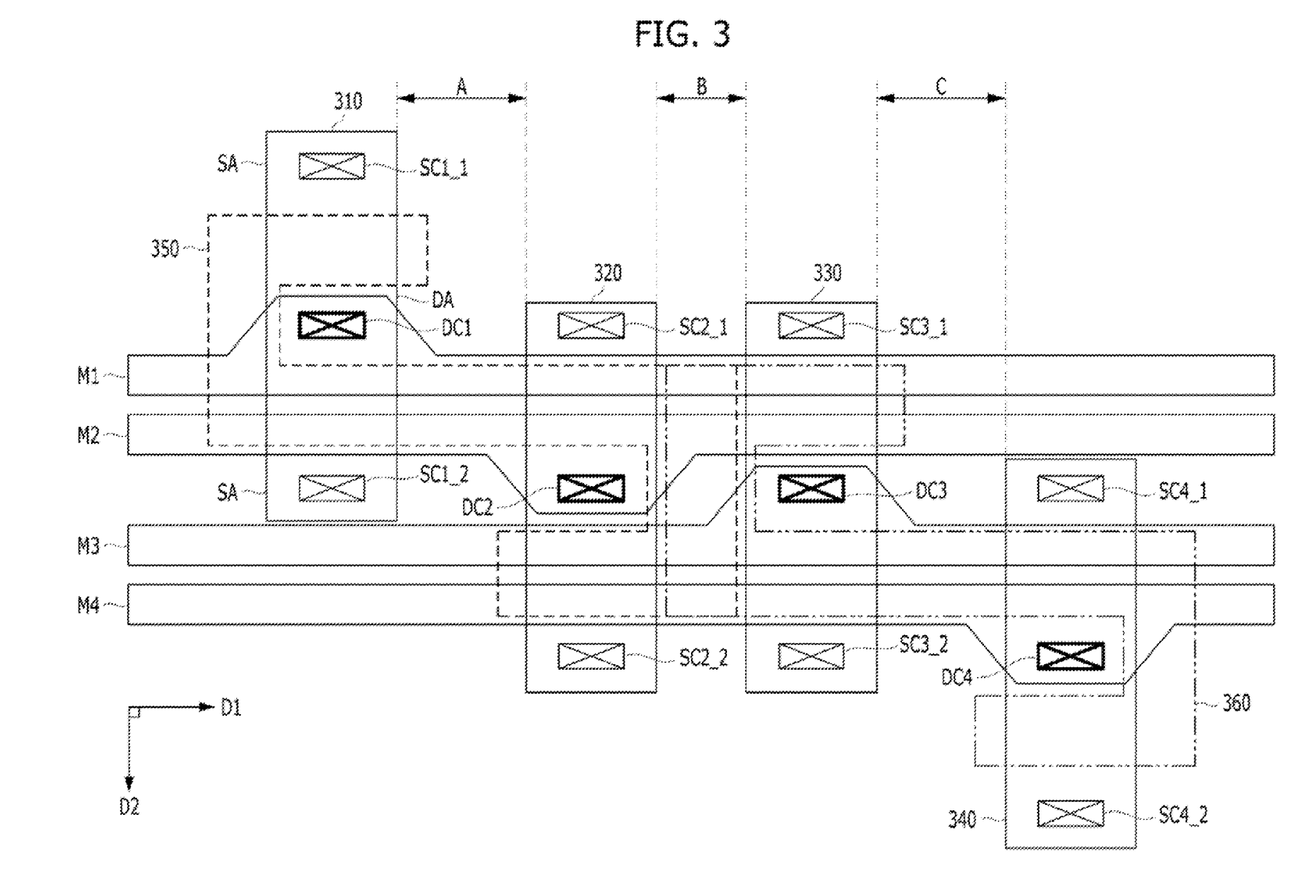
FIG. 3 is a layout diagram illustrating an arrangement of a PMOS transistor region of a word line driver circuit in accordance with an embodiment of the present invention.

FIG. 3 is a diagram illustrating an arrangement of a PMOS transistor region of a word line driver circuit in accordance with an embodiment of the present invention.

Referring to FIG. 3, the word line driver circuit may include first to fourth PMOS transistors (P1 to P4 of FIG. 1) in the PMOS transistor region. The first to fourth PMOS transistors P1 to P4 may include respective first to fourth active regions 310 to 340, a first gate region 350, a second gate region 360, and respective first to fourth metal lines M1 to M4.

The first to fourth PMOS transistors P1 to P4 may respectively include the first to fourth active regions 310 to 340.

The first to fourth active regions 310 to 340 may be spaced apart from each other at specific intervals in a first direction D1, and extend to a second direction D2 which is substantially perpendicular to the first direction D1. More specifically, the second active region 320 may be spaced apart from the first active region 310 at a first interval A in the first direction D1, and spaced apart from the first active region 310 in a second direction D2. The second active region 320 may be disposed on the lower side of the first active region 310 in the second direction D2 on the same plane as the first active region 310. The third active region 330 may be spaced apart from the second active region 320 at a second interval B in the first direction D1, and may be disposed in parallel with the second active region 320. The fourth active region 340 may be spaced apart from the third active region 330 at a third interval C in the first direction D1 and spaced apart from the third active region 330 in the second direction D2. The fourth active region 340 may be disposed on the lower side of the third active region 330 in the second direction D2 on the same plane as the third active region 330.

Furthermore, the first interval A between the first active region 310 and the second active region 320 may be wider than the second interval B between the second active region 320 and the third active region 330. The third interval C between the third active region 330 and the fourth active region 340 may be wider than the second interval B between the second active region 320 and the third active region 330.

Source regions SA may be formed at both ends of each of the first to fourth active regions 310 to 340.

A first source contact SC1_1 placed on a first end of the first active region 310 and a second source contact SC1_2 placed on a second end of the first active region 310 may be formed in the respective source regions SA formed at the both ends of the first active region 310. The first and second source contacts SC1_1 and SC1_2 may be connected to a metal line (not illustrated) and supplied with a first sub-word line selection signal (FX1 of FIG. 1). The first and second source contacts SC1_1 and SC1_2 may electrically connect the metal line with the source regions SA.

A first source contact SC2_1 placed on a first end of the second active region 320 and a second source contact SC2_2 placed on a second end of the second active region 320 may be formed in respective source regions SA formed at the both ends of the second active region 320. The first and second source contacts SC2_1 and SC2_2 may be connected to a metal line (not illustrated) and supplied with a second sub-word line selection signal (FX2 of FIG. 1). The first and second source contacts SC2_1 and SC2_2 may electrically connect the metal line with the source regions SA.

A first source contact SC3_1 placed on a first end of the third active region 330 and a second source contact SC3_2 placed on a second end of the third active region 330 may be formed in respective source regions SA formed at the both ends of the third active region 330. The first and second source contacts SC3_1 and SC3_2 may be connected to a metal line (not illustrated) and supplied with a third sub-word line selection signal (FX3 of FIG. 1). The first and second source contacts SC3_1 and SC3_2 may electrically connect the metal line with the source regions SA.

A first source contact SC4_1 placed on a first end of the fourth active region 340 and a second source contact SC4_2 placed on a second end of the fourth active region 340 may be formed in respective source regions SA formed at the both ends of the fourth active region 340. The first and second source contacts SC4_1 and SC4_2 may be connected to a metal line (not illustrated) and supplied with a fourth sub-word line selection signal (FX4 of FIG. 1). The first and second source contacts SC4_1 and SC4_2 may electrically connect the metal line with the source regions SA.

Drain regions DA may be formed in the first to fourth active regions 310 to 340 between the source regions SA formed at the both ends of each of the first to fourth active regions 310 to 340. First to fourth drain contacts DC1 to DC4 may be formed in the drain regions DA of the first to fourth active regions 310 to 340, respectively.

The first drain contact DC1 formed in the first active region 310 may be disposed in the same line as the first source contact SC2_1 formed in the second active region 320 and the first source contact SC3_1 formed in the third active region 330.

The second drain contact DC2 formed in the second active region 320 and the third drain contact DC3 formed in the third active region 330 may be disposed in the same line as the second source contact SC1_2 formed in the first active region 310, and the first source contact SC4_1 formed in the fourth active region 340.

The fourth drain contact DC4 formed in the fourth active region 340 may be disposed in the same line as the second source contact SC2_2 formed in the second active region 320 and the second source contact SC3_2 formed in the third active region 330.

The first to fourth drain contacts DC1 to DC4 may be respectively connected to the first to fourth metal lines M1 to M4. The first to fourth metal lines M1 to M4 may extend to the first direction D1, and be spaced apart from each other in the second direction D2.

The first metal line M1 may be disposed to intersect the first to third active regions 310 to 330. The first metal line M1 may include a protrusion region that is protruded from one side in an opposite direction to the second direction D2 and connected to the first drain contact DC1. The first metal line M1 may maintain a constant width in the remaining regions except for the protrusion region connected to the first drain contact DC1.

The second metal line M2 may be disposed to intersect the first to third active regions 310 to 330. The second metal line M2 may include a protrusion region protruded from one side in the second direction D2, and connected to the second drain contact DC2. The second metal line M2 may maintain a constant width in the remaining regions except for the specific region connected to the second drain contact DC2.

In other words, the protrusion regions of the first metal line M1 and the second metal line M2 where they are respectively connected to the first and second drain contacts DC1 and DC2 may be disposed in opposite directions.

The third metal line M3 may be disposed to intersect the second to fourth active regions 320 to 340. The third metal line M3 may include a protrusion region protruded from one side in the opposite direction to the second direction D2, and connected to the third drain contact DC3. The third metal line M3 may maintain a constant width in the remaining regions except for the specific region connected to the third drain contact DC3.

The fourth metal line M4 may be disposed to intersect the second to fourth active regions 320 to 340. The fourth metal line M4 may include a protrusion region protruded from one side in the second direction D2, and connected to the fourth drain contact DC4. The fourth metal line M4 may maintain a constant width in the remaining regions except for the specific region connected to the fourth drain contact DC4.

In other words, the protrusion regions of the third metal line M3 and the fourth metal line M4 where they are respectively connected to the third and fourth drain contacts DC3 and DC4 may be disposed in opposite directions.

Furthermore, assuming that the first metal line M1 and the second metal line M2 form a first metal line pair and the third metal line M3 and the fourth metal line M4 form a second metal line pair, the second metal line pair and the first metal line pair may have a symmetrical structure in which they have been rotated 180 degrees in relation to each other.

The first gate region 350 may be configured to cross regions between the first drain contact DC1 and the second source contact SC1_2 of the first active region 310 and between the second drain contact DC2 and the first source contact SC2_1 of the second active region 320 in a straight line, and to counterclockwise extend in such a way as to surround a part of the first drain contact DC1 and to clockwise extend in such a way as to surround a part of the second drain contact DC2. More specifically, the first gate region 350 may have a structure in which one side of the first drain contact DC1, and one side of the second drain contact DC2, which is opposite to the one side of the first drain contact DC1, are open. The first gate region 350 may be adjacent to the first and second drain contacts DC1 and DC2 in a gap of a specific level.

Likewise, the second gate region 360 may be configured to cross regions between the third drain contact DC3 and the second source contact SC3_2 of the third active region 330 and between the fourth drain contact DC4 and the first source contact SC4_1 of the fourth active region 340 in a straight line, and to counterclockwise extend in such a way as to surround a part of the third drain contact DC3 and to clockwise extend in such a way as to surround a part of the fourth drain contact DC4. More specifically, the second gate region 360 may have a structure in which one side of the third drain contact DC3, and one side of the fourth drain contact DC4, which is opposite to the one side of the third drain contact DC3, are open. The second gate region 360 may be adjacent to the third and fourth drain contacts DC3 and DC4 in a gap of a specific level.

The second gate region 360 has the same shape as the first gate region 350, but the second gate region 360 and the first gate region 350 may have a symmetrical structure in which they have been rotated 180 degrees in relation to each other. Furthermore, the first gate region 350 may partially overlap with the second gate region 360 between the second active region 320 and the third active region 330. The first and second gate regions 350 and 360 have an overlap structure and thus may be supplied with the same main word line signal (MWLB of FIG. 1).

The first to fourth PMOS transistors P1 to P4 may be driven in response to the main word line signal MWLB applied through the first and second gate regions 350 and 360 and the first to fourth sub-word line selection signals FX1 to FX4 applied through the first and second source contacts SC1_1 to SC4_1 and SC1_2 to SC4_2. The first to fourth PMOS transistors P1 to P4 may receive the first to fourth sub-word line selection signals FX1 to FX4 serving as pull-up driving signals selectively activated in response to address information, through the respective first source contact SC1_1 to SC4_1 and the respective second source contact SC1_2 to SC4_2. Accordingly, the first to fourth PMOS transistors P1 to P4 may form respective current paths between the source regions SA and the drain regions DA. The current paths may extend to the first to fourth metal lines M1 to M4 through the first to fourth drain contacts DC1 to DC4. As a result, first to fourth word line signals (WL1 and WL4 of FIG. 1) are activated due to the current paths extended to the first to fourth metal lines M1 to M4.

In the word line driver circuit in accordance with the embodiment of the present invention, all the first and second source contacts SC1_1 to SC4_1 and SC1_2 to SC4_2 and the first to fourth drain contacts DC1 to DC4 of the first to fourth PMOS transistors P1 to P4 may be disposed in a straight line. Furthermore, the word line driver circuit may secure a uniform driving force for the first to fourth PMOS transistors P1 to P4 since the first and second gate regions 350 and 360 and the first to fourth drain contacts DC1 to DC4 are disposed at the same intervals. Accordingly, the word line driver circuit can stably activate first to fourth word lines in response to the first to fourth word line signals WL1 and WL4. Furthermore, the word line driver circuit may prevent performance of the first to fourth PMOS transistors P1 to P4 from being deteriorated.

Figure 4:
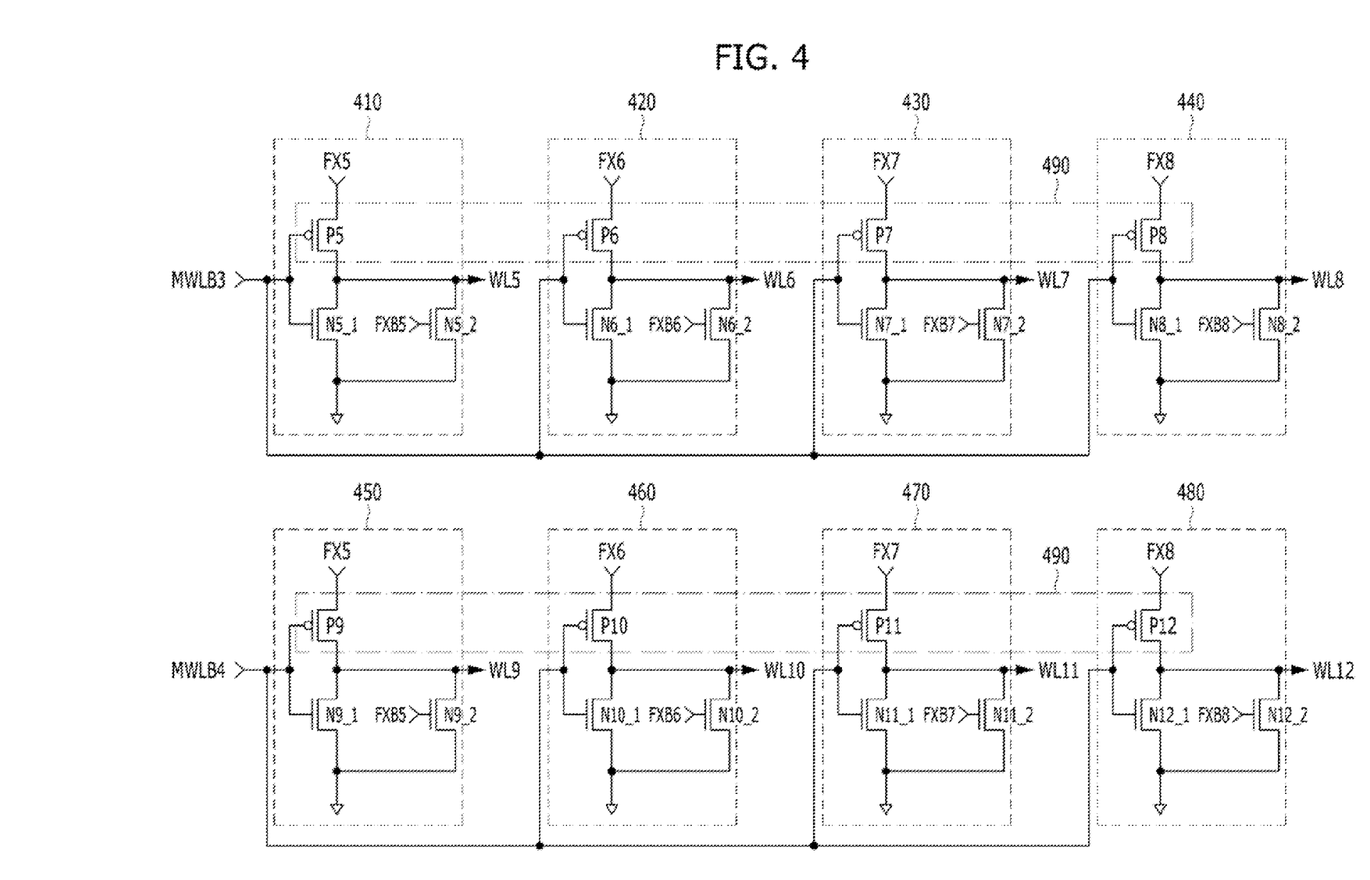
FIG. 4 is a circuit diagram of a word line driver circuit in accordance with an embodiment of the present invention.

FIG. 4 is a circuit diagram of a word line driver circuit in accordance with an embodiment of the present invention.

Referring to FIG. 4, the word line driver circuit may include first to eighth word line drivers 410 to 480. The word line driver circuit may include a PMOS transistor region 490 including first to eighth PMOS transistors P5 to P12.

The first word line driver 410 may include the fifth PMOS transistor P5 for pulling up a fifth word line signal WL5 to a level of a fifth sub-word line selection signal FX5 in response to a third main word line signal MWLB3, an NMOS transistor N5_1 for pulling down the fifth word line signal WL5 to a ground voltage level in response to the third main word line signal MWLB3, and an NMOS transistor N5_2 for pulling down the fifth word line signal WL5 to the ground voltage level in response to a fifth inverse sub-word line selection signal FXB5.

The fifth PMOS transistor P5 may have a gate receiving the third main word line signal MWLB3, a source receiving the fifth sub-word line selection signal FX5, and a drain connected to an output line for outputting a signal that has been pulled up to the level of the fifth sub-word line selection signal FX5, as the fifth word line signal WL5.

The second to fourth word line drivers 420 to 440 may have the same configurations as the first word line driver 410.

The fifth word line driver 450 may include the ninth PMOS transistor P9 for pulling up a ninth word line signal WL9 to the level of the fifth sub-word line selection signal FX5 in response to a fourth main word line signal MWLB4, an NMOS transistor N9_1 for pulling down the ninth word line signal WL9 to the ground voltage level in response to the fourth main word line signal MWLB4, and an NMOS transistor N9_2 for pulling down the ninth word line signal WL9 to the ground voltage level in response to the fifth inverse sub-word line selection signal FXB5.

The ninth PMOS transistor P9 may have a gate receiving the fourth main word line signal MWLB4, a source region receiving the fifth sub-word line selection signal FX5, and a drain connected to the output line for outputting a signal that has been pulled up to the level of the fifth sub-word line selection signal FX5, as a ninth word line signal WL9.

The sixth to eighth word line drivers 460 to 480 may have the same configurations as the fifth word line driver 450.

The first to fourth word line drivers 410 to 440 may activate the fifth to eighth word line signals WL5 to WL8 in response to the third main word line signal MWLB3 and the fifth to eighth sub-word line selection signals FX5 to FX8, respectively. Furthermore, the fifth to eighth word line drivers 450 to 480 may activate the ninth to twelfth word line signals WL9 to WL12 in response to the fourth main word line signal MWLB4 and the fifth to eighth sub-word line selection signals FX5 to FX8, respectively.

Figure 5:
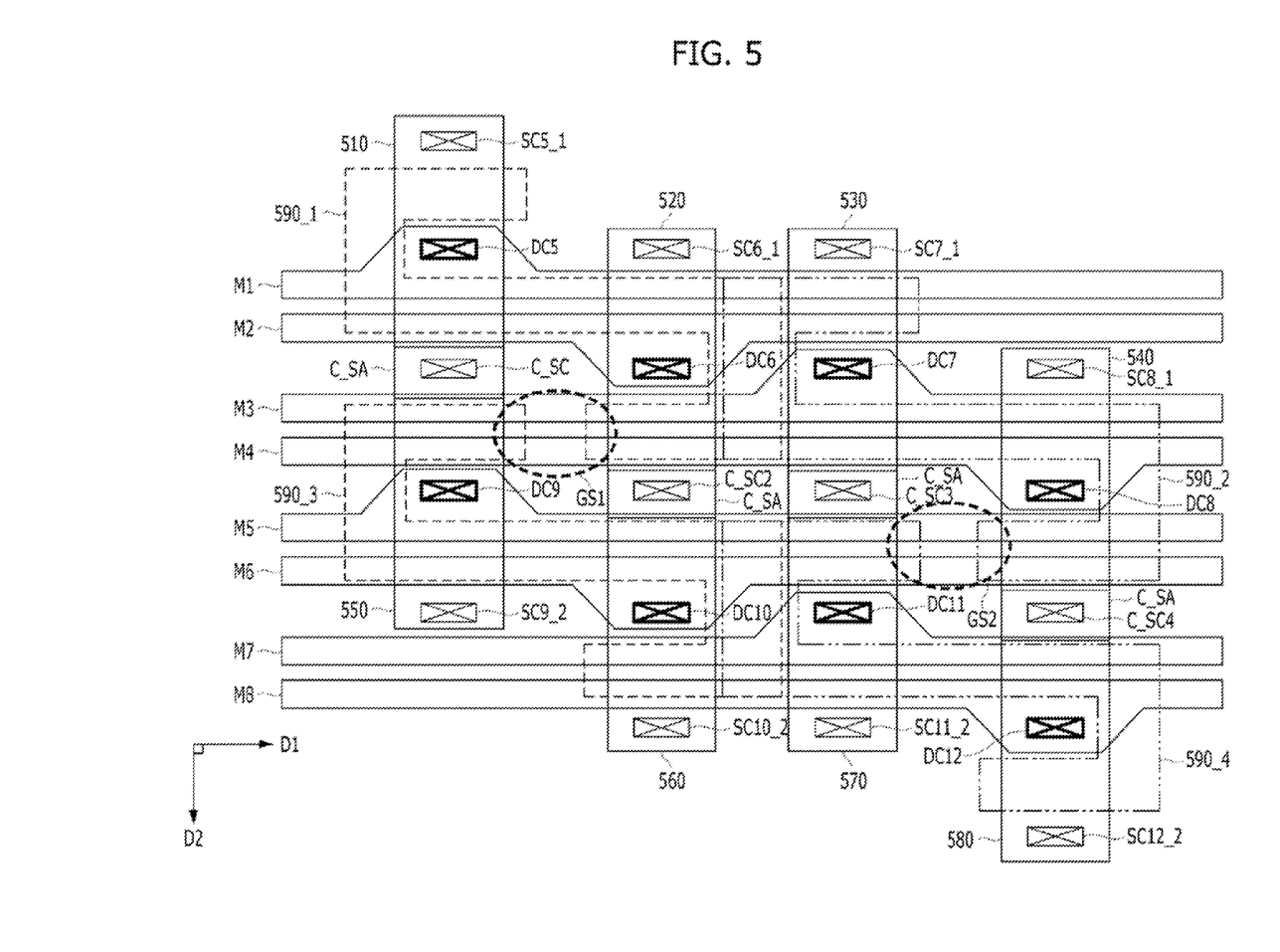
FIG. 5 is a layout diagram illustrating an arrangement of a PMOS transistor region illustrated in FIG. 4.

FIG. 5 is a diagram illustrating an arrangement of the PMOS transistor region 490 illustrated in FIG. 4.

Referring to FIG. 5, the PMOS transistor region 490 may include the fifth to twelfth PMOS transistors P5 to P12.

The fifth to eighth PMOS transistors P5 to P8 may have the same configurations as those described with reference to FIG. 3. The fifth to eighth PMOS transistors P5 to P8 may include respective first to fourth active regions 510 to 540, a first gate region 590_1, a second gate region 590_2, and respective first to fourth metal lines M1 to M4.

Likewise, the ninth to twelfth PMOS transistors P9 to P12 may have the same configurations as those described with reference to FIG. 3. The ninth to twelfth PMOS transistors P9 to P12 may include respective fifth to eighth active regions 550 to 580, a third gate region 590_3, a fourth gate region 590_4, and respective fifth to eighth metal lines M5 to M8.

The fifth active region 550 may overlap with a source region C_SA formed on a second end of the first active region 510 and may be disposed below the first active region 510 in a second direction D2 on the same plane as the first active region 510. The sixth active region 560 may overlap with a source region C_SA formed on a second end of the second active region 520 and may be disposed below the second active region 520 in the second direction D2 on the same plane as the second active region 520. The seventh active region 570 may overlap with a source region C_SA formed on a second end of the third active region 530 and may be disposed below the third active region 530 in the second direction D2 on the same plane as the third active region 530. The eighth active region 580 may overlap with a source region C_SA formed on a second end of the fourth active region 540 and may be disposed below the fourth active region 540 in the second direction D2 on the same plane as the fourth active region 540.

The fifth to eighth active regions 550 to 580 may share source contacts C_SC1, C_SC2, C_SC3, and C_SC4 formed in the source regions C_SA, with the first to fourth active regions 510 to 540, respectively, since they overlap with the respective source regions C_SA formed on the second ends of the first to fourth active regions 510 to 540. The source contacts are hereinafter called first to fourth common source contacts C_SC1, C_SC2, C_SC3, and C_SC4.

A fifth drain contact DC5, a sixth drain contact DC6, a ninth drain contact DC9, and a tenth drain contact DC10 may be disposed in zigzags in the second direction D2. Furthermore, a seventh drain contact DC7, a eighth drain contact DC8, a eleventh drain contact DC11, and an twelfth drain contact DC12 may be disposed in zigzags in the second direction D2.

Likewise, a first source contact SC5_1, a first source contact SC6_1, the first common source contacts C_SC1, the second common source contacts C_SC2, a second source contact SC9_2, and a second source contact SC10_2 may be disposed in zigzags in the second direction D2. Furthermore, a first source contact SC7_1, a first source contact SC8_1, the third common source contacts C_SC3, the fourth common source contacts C_SC4, a second source contact SC11_2, and a second source contact SC12_2 may be disposed in zigzags in the second direction D2.

The structures of the first to fourth gate regions 590_1 to 590_4 are described below.

The first gate region 590_1 may be configured to cross regions between the fifth drain contact DC5 and the first common source contact C_SC1 of the first active region 510 and between the sixth drain contact DC6 and the first source contact SC2_1 of the second active region 520 in a straight line, counterclockwise surround a part of the fifth drain contact DC5, and clockwise surround a part of the sixth drain contact DC6. The first gate region 590_1 may have a structure in which one side of the fifth drain contact DC5, and one side of the sixth drain contact DC6, which is opposite to the one side of the fifth drain contact DC5, are open. The first gate region 590_1 may be adjacent to each of the fifth and sixth drain contacts DC5 and DC6 in a gap of a specific level.

The second gate region 590_2 may be configured to cross regions between the seventh drain contact DC7 and the third common source contact C_SC3 of the third active region 530 and between the eighth drain contact DC8 and the first source contact SC4_1 of the fourth active region 540 in a straight line, counterclockwise surround a part of the seventh drain contact DC7, and clockwise surround a part of the eighth drain contact DC8. The second gate region 590_2 may have a structure in which one side of the seventh drain contact DC7 and one side of the eighth drain contact DC8, which is opposite to the one side of the seventh drain contact DC7, are open. The second gate region 590_2 may be adjacent to each of the seventh and eighth drain contacts DC7 and DC8 in a gap of a specific level.

Furthermore, the first gate region 590_1 may overlap with the second gate region 590_2 between the second active region 520 and the third active region 530. The first and second gate regions 590_1 and 590_2 may be simultaneously supplied with the third main word line signal (MWLB3 of FIG. 4) since they have an overlapping structure.

The third gate region 590_3 may be configured to cross regions between the ninth drain contact DC9 and the second source contact SC5_2 of the fifth active region 550 and between the tenth drain contact DC10 and the second common source contact C_SC2 of the sixth active region 560 in a straight line, counterclockwise surround a part of the ninth drain contact DC9, and clockwise surround a part of the tenth drain contact DC10. The third gate region 590_3 may have a structure in which one side of the ninth drain contact DC9 and one side of the tenth drain contact DC10, which is opposite to the one side of the ninth drain contact DC9, are open. The third gate region 590_3 may be adjacent to each of the ninth and the tenth drain contacts DC9 and DC10 in a gap of a specific level.

The fourth gate region 590_4 may be configured to cross regions between the eleventh drain contact DC11 and the second source contact SC7_2 of the seventh active region 570 and between the twelfth drain contact DC12 and the fourth common source contact C_SC4 of the eighth active region 580 in a straight line, counterclockwise surround a part of the eleventh drain contact DC11, and clockwise surround a part of the twelfth drain contact DC12. The fourth gate region 590_4 may have a structure in which one side of the eleventh drain contact DC11 and one side of the twelfth drain contact DC12, which is opposite to the one side of the eleventh drain contact DC11, are open. The fourth gate region 590_4 may be adjacent to each of the eleventh and the twelfth drain contacts DC11 and DC12 in a gap of a specific level.

Furthermore, the third gate region 590_3 may overlap with the fourth gate region 590_4 between the sixth active region 560 and the seventh active region 570. The third and fourth gate regions 590_3 and 590_4 may be simultaneously supplied with the fourth main word line signal (MWLB4 of FIG. 4) since they have an overlap structure.

An end of the first gate region 590_1 which clockwise surrounds the sixth drain contact DC6 and an end of the third gate region 590_3 which counterclockwise surrounds the ninth drain contact DC9 may be spaced apart from each other in a first direction D1 at a first interval and disposed to face each other. The first interval may be a first gate space GS1.

Furthermore, an end of the second gate region 590_2 which clockwise surrounds the eighth drain contact DC8 and an end of the fourth gate region 590_4 which counterclockwise surrounds the eleventh drain contact DC11 may be spaced apart from each other at a second interval in the first direction D1 and disposed to face each other. The second interval may be a second gate space GS2.

The first and second gate spaces GS1 and GS2 may be spaces for physically separating the first and second gate regions 590_1 and 590_2 supplied with the third main word line signal MWLB3 and the third and fourth gate regions 590_3 and 590_4 supplied with the fourth main word line signal MWLB4.

The word line driver circuit in accordance with the embodiment of the present invention may separate the regions of the fifth to eighth PMOS transistors P5 to P8 from the third gate region 590_3 supplied with the fourth main word line signal MWLB4 due to the first gate space GS1. The word line driver circuit may separate the regions of the ninth to twelfth PMOS transistors P9 to P12 from the second gate region 590_2 supplied with the third main word line signal MWLB3 due to the second gate space GS2.

For example, the locations and types of the logic gates and transistors illustrated in the aforementioned embodiments may be differently implemented depending on the polarity of the input signals.

The word line driver circuit according to the proposed embodiments may secure a uniform driving force for a plurality of transistors and thus secure operation stability since contacts formed in the plurality of transistors are disposed in a line and the intervals between gate regions and drain contacts are identically disposed.

Although various embodiments have been described for illustrative purposes, it will be apparent to those skilled in the art that various changes and modifications may be made without departing from the spirit and scope of the invention as defined in the following claims.

What is claimed is:

1. A word line driver circuit of a semiconductor memory device, comprising:
   a first active region;
   a second active region spaced apart from the first active region in a first direction and spaced apart from the first active region in a second direction, which is substantially perpendicular to the first direction;
   first contacts formed at both ends of each of the first and second active regions;
   second contacts formed in the first and second active regions between the first contacts; and
   a gate region between the first contact formed on a second end of the first active region and the second contact formed in the first active region, and between the first contact formed on a first end of the second active region and the second contact formed in the second active region in a straight line, counterclockwise surrounding a part of the second contact formed in the first active region, and clockwise surrounding a part of the second contact formed in the second active region.

2. The word line driver circuit of claim 1, wherein the gate region has a structure in which a first side of the second contact formed in the first active region and a second side of the second contact formed in the second active region are open and the gate region is adjacent to the second contacts in a gap of a specific level.

3. The word line driver circuit of claim 1, wherein the second active region is below the first active region in the second direction on the same plane as the first active region.

4. The word line driver circuit of claim 1, further comprising:
   a first metal line that intersects the first and second active regions, including a protrusion region that protrudes from one side in an opposite direction to the second direction and coupled to the second contact formed in the first active region; and
   a second metal line that intersects the first and second active regions, and including a protrusion region that protrudes from one side in the second direction and coupled to the second contact formed in the second active region.

5. The word line driver circuit of claim 4, wherein each of the first metal line and the second metal line maintains a constant width in the remaining regions except for the protrusion region coupled to the second contact.

6. The word line driver circuit of claim 1, wherein:
   the second contact formed in the first active region is in the same line as the first contact formed on the first end of the second active region, and
   the second contact formed in the second active region is in the same line as the first contact formed on the second end of the first active region.

7. The word line driver circuit of claim 1, wherein:
   the first contact comprises a source contact electrically coupled to a source region, and
   the second contact comprises a drain contact electrically coupled to a drain region.

8. A word line driver circuit of a semiconductor memory device, comprising:
   a first active region;
   a second active region spaced apart from the first active region at a first interval in a first direction and spaced apart from the first active region in a second direction, which is substantially perpendicular to the first direction;
   a third active region spaced apart from the second active region at a second interval in the first direction;
   a fourth active region spaced apart from the third active region at a third interval in the first direction and spaced apart from the third active region in the second direction;
   first contacts formed at both sides of ends of the first to fourth active regions;
   second contacts formed in the first to fourth active regions between the first contacts;
   a first gate region crossing between the first contact formed on a second end of the first active region and the second contact formed in the first active region and between the first contact formed on a first end of the second active region and the second contact formed in the second active region in a straight line, counterclockwise surrounding a part of the second contact formed in the first active region, and clockwise surrounding a part of the second contact formed in the second active region; and
   a second gate region between the first contact formed on a second end of the third active region and the second contact formed in the third active region and between the first contact formed on a first end of the fourth active region and the second contact formed in the fourth active region in a straight line, counterclockwise surrounding a part of the second contact formed in the third active region, and clockwise surrounding a part of the second contact formed in the fourth active region,
   wherein the first gate region partially overlaps with the second gate region.

9. The word line driver circuit of claim 8, wherein the first gate region partially overlaps with the second gate region between the second active region and the third active region.

10. The word line driver circuit of claim 8, wherein the first gate region has a structure in which a first side of the second contact formed in the first active region and a second side of the second contact formed in the second active region are open and the first gate region is adjacent to the second contacts in a gap of a specific level.

11. The word line driver circuit of claim 8, wherein the second gate region has a structure in which a first side of the second contact formed in the third active region and a second side of the second contact formed in the fourth active region are open and the second gate region is adjacent to the second contacts in a gap of a specific level.

12. The word line driver circuit of claim 8, wherein the second gate region and the first gate region have a symmetrical structure.

13. The word line driver circuit of claim 8, wherein:
the second active region is below the first active region in the second direction on the same plane as the first active region,
the third active region and the second active region are parallel, and
the fourth active region is below the third active region in the second direction on the same plane as the third active region.

14. The word line driver circuit of claim 8, further comprising:
a first metal line pair that intersects the first to third active regions, each metal line including a protrusion region coupled to the second contacts respectively formed in the first and second active regions; and
a second metal line pair that intersects the second to fourth active regions, each metal line including a protrusion region coupled to the second contacts respectively formed in the third and fourth active regions.

15. The word line driver circuit of claim 14, wherein the second metal line pair and the first metal line pair have a symmetrical structure.

16. The word line driver circuit of claim 14, wherein each metal line of the first and second metal line pairs maintains a constant width in the remaining regions except for the protrusion region coupled to the second contact.

17. The word line driver circuit of claim 8, wherein:
the second contact formed in the first active region is in the same line as the first contact formed on the first end of the second active region and the first contact formed on a first end of the third active region,
the second contacts formed in the second active region and the third active region are in the same line as the first contact formed on the second end of the first active region and the first contact formed on the first end of the fourth active region, and
the second contact formed in the fourth active region is in the same line as the first contact formed on a second end of the second active region and the first contact formed on the second end of the third active region.

18. The word line driver circuit of claim 8, wherein:
the first contact comprises a source contact electrically coupled to a source region, and
the second contact comprises a drain contact electrically coupled to a drain region.

19. The word line driver circuit of claim 8, wherein the first interval is wider than the second interval, and the third interval is wider than the second interval.

20. A word line driver circuit of a semiconductor memory device, comprising:
a first active region;
a second active region spaced apart from the first active region in a first direction and spaced apart from the first active region in a second direction, which is substantially perpendicular to the first direction;
a third active region that partially overlaps with the first active region in the second direction;
a fourth active region that partially overlaps with the second active region in the second direction;
first contacts formed at first ends of the first and second active regions, second ends of the third and fourth active regions, a first common end where the first and third active regions overlap with each other, and a second common end where the second and fourth active regions overlap with each other;
second contacts formed in the first to fourth active regions between the first contacts;
a first gate region between the first contact formed on the first common end and the second contact formed in the first active region and between the first contact formed on the first end of the second active region and the second contact formed in the second active region in a straight line, counterclockwise surrounding a part of the second contact formed in the first active region, and clockwise surrounding a part of the second contact formed in the second active region; and
a second gate region between the first contact formed on the second end of the third active region and the second contact formed in the third active region and between the first contact formed on the second common end and the second contact formed in the fourth active region in a straight line, counterclockwise surrounding a part of the second contact formed in the third active region, and clockwise surrounding a part of the second contact formed in the fourth active region,
wherein an end of the first gate region which clockwise surrounds the second contact formed in the second active region and an end of the second gate region which counterclockwise surrounds part of the second contact formed in the third active region are spaced apart from each other in the first direction and face each other.

21. The word line driver circuit of claim 20, wherein the second contacts formed in the first to fourth active regions zigzag in the second direction.

22. The word line driver circuit of claim 20, wherein the first contacts formed in the first to fourth active regions zigzag in the second direction.

* * * * *